(12) United States Patent
Cha

(10) Patent No.: US 11,404,623 B2
(45) Date of Patent: Aug. 2, 2022

(54) METHOD OF MANUFACTURING BULK TYPE THERMOELECTRIC ELEMENT

(71) Applicant: HUMOTT Co., Ltd., Osan-si (KR)

(72) Inventor: Jin-Hwan Cha, Suwon-si (KR)

(73) Assignee: HUMOTT CO., LTD., Osan-si (KR)

( * ) Notice: Subject to any disclaimer, the term of this patent is extended or adjusted under 35 U.S.C. 154(b) by 0 days.

(21) Appl. No.: 17/279,559

(22) PCT Filed: Oct. 12, 2018

(86) PCT No.: PCT/KR2018/012027
§ 371 (c)(1),
(2) Date: Mar. 24, 2021

(87) PCT Pub. No.: WO2020/075890
PCT Pub. Date: Apr. 16, 2020

(65) Prior Publication Data
US 2021/0399189 A1    Dec. 23, 2021

(30) Foreign Application Priority Data
Oct. 10, 2018 (KR) .................... 10-2018-0120192

(51) Int. Cl.
*H01L 35/34* (2006.01)
*H01L 35/08* (2006.01)
*H01L 35/32* (2006.01)

(52) U.S. Cl.
CPC .............. *H01L 35/34* (2013.01); *H01L 35/08* (2013.01); *H01L 35/32* (2013.01)

(58) Field of Classification Search
None
See application file for complete search history.

(56) References Cited

U.S. PATENT DOCUMENTS

| 7,531,739 B1* | 5/2009 | Moczygemba | ......... H01L 35/34 |
|---|---|---|---|
| | | | 136/201 |
| 2001/0001960 A1* | 5/2001 | Hiraishi | ................. H01L 35/32 |
| | | | 136/201 |

(Continued)

FOREIGN PATENT DOCUMENTS

| JP | 2001119077 A | 4/2001 |
|---|---|---|
| JP | 2001274466 A | 10/2001 |

(Continued)

OTHER PUBLICATIONS

International Search Report of PCT/KR2018/012027, dated Jul. 9, 2019, English tranlsation.

*Primary Examiner* — Daniel P Malley, Jr.
(74) *Attorney, Agent, or Firm* — STIP Law Group, LLC

(57) ABSTRACT

The present invention relates to a method of manufacturing a bulk type thermoelectric element implemented so as to simplify the manufacturing process as well as to reduce the manufacturing cost. The method of manufacturing a bulk type thermoelectric element includes the steps of: preparing two types of P-type and N-type substrates by slicing a thermoelectric element material; bonding P-type pellets formed on the P-type substrate and N-type pellets formed on the N-type substrate to each other to alternately engaging with each other, and then polishing (grinding) the bottom of each substrate to form a P/N layer in which the P-type pellets and the N-type pellets are cross-formed; and assembling ceramic substrates with conductive electrode pads (PAD) on the top and the bottom of the P/N layer to complete a thermoelectric element.

5 Claims, 6 Drawing Sheets

(56) References Cited

U.S. PATENT DOCUMENTS

2014/0318588 A1* 10/2014 Kouma .................. H01L 35/32
                                                    136/200
2018/0219148 A1*  8/2018 Sung ..................... H01L 35/08
2019/0131508 A1*  5/2019 Kasztelan ............... H01L 35/34

FOREIGN PATENT DOCUMENTS

JP      2004296960 A    10/2004
KR      19990077112 A   10/1999
KR      20170091386 A    8/2017

* cited by examiner

[FIG. 1]
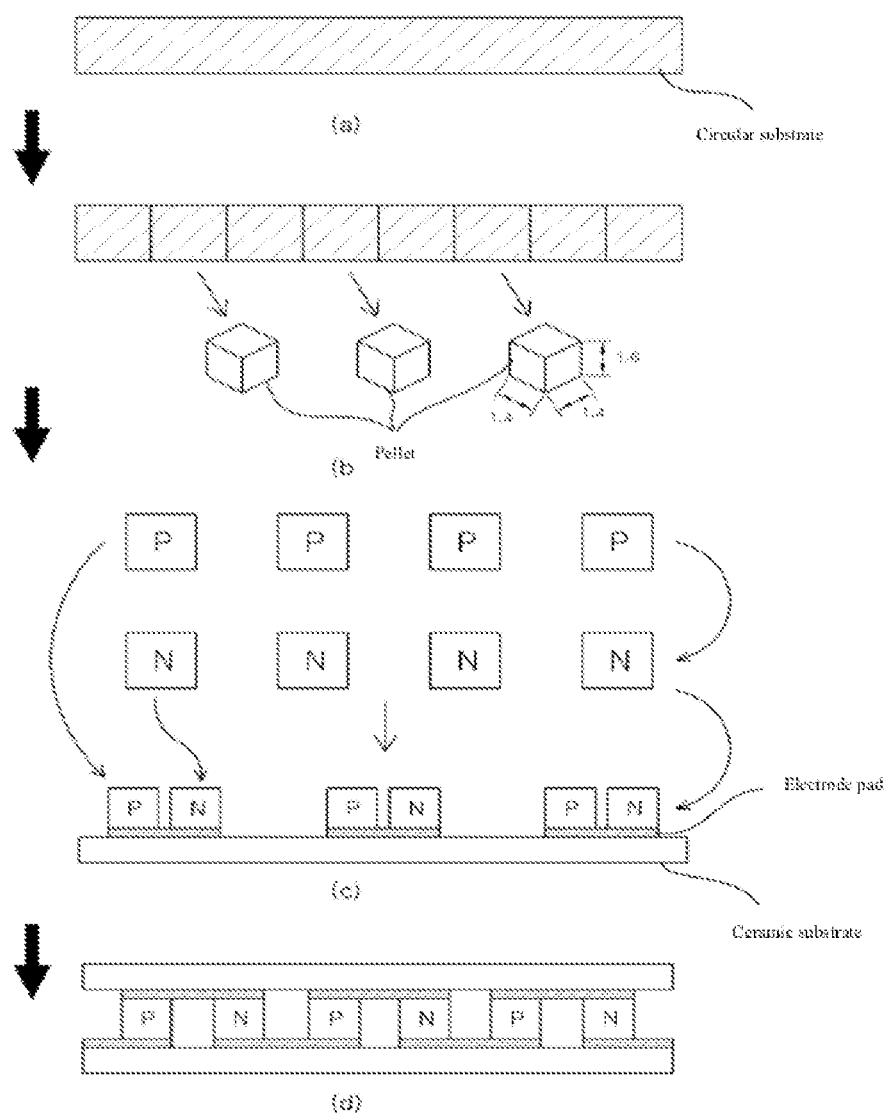

[FIG. 2]
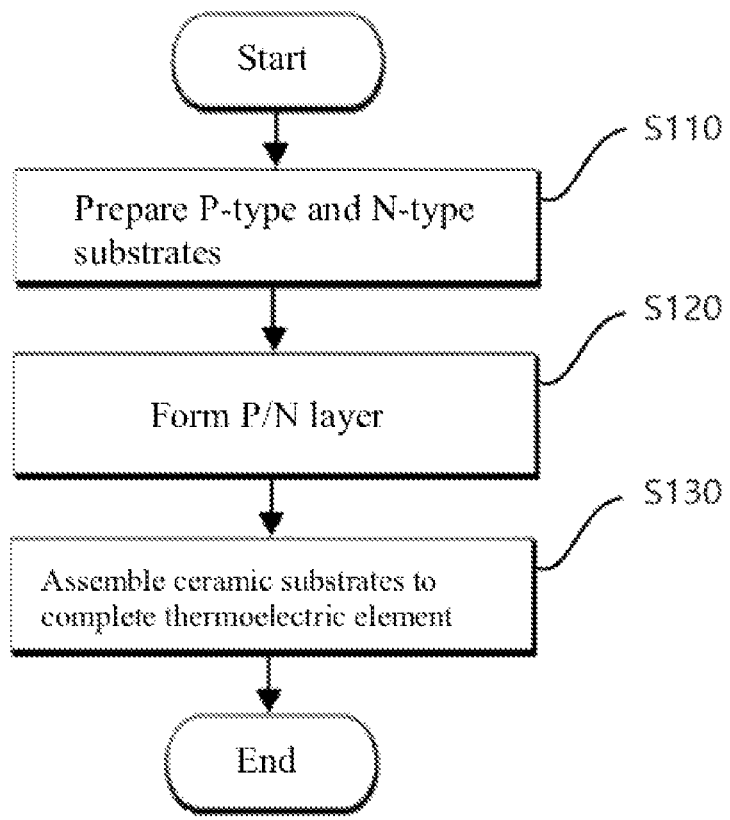

[FIG. 3]
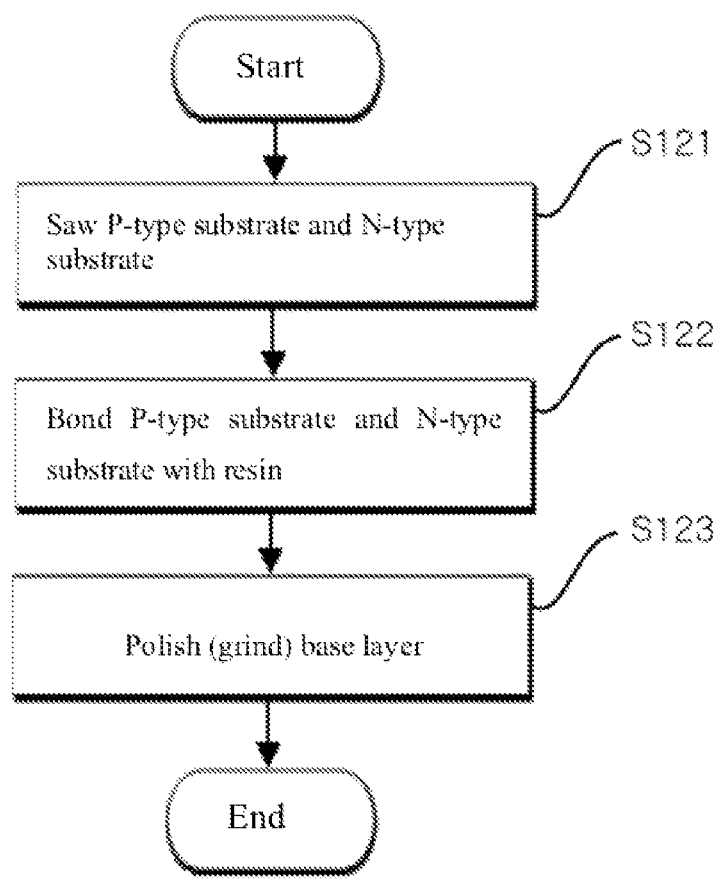

[FIG. 4]
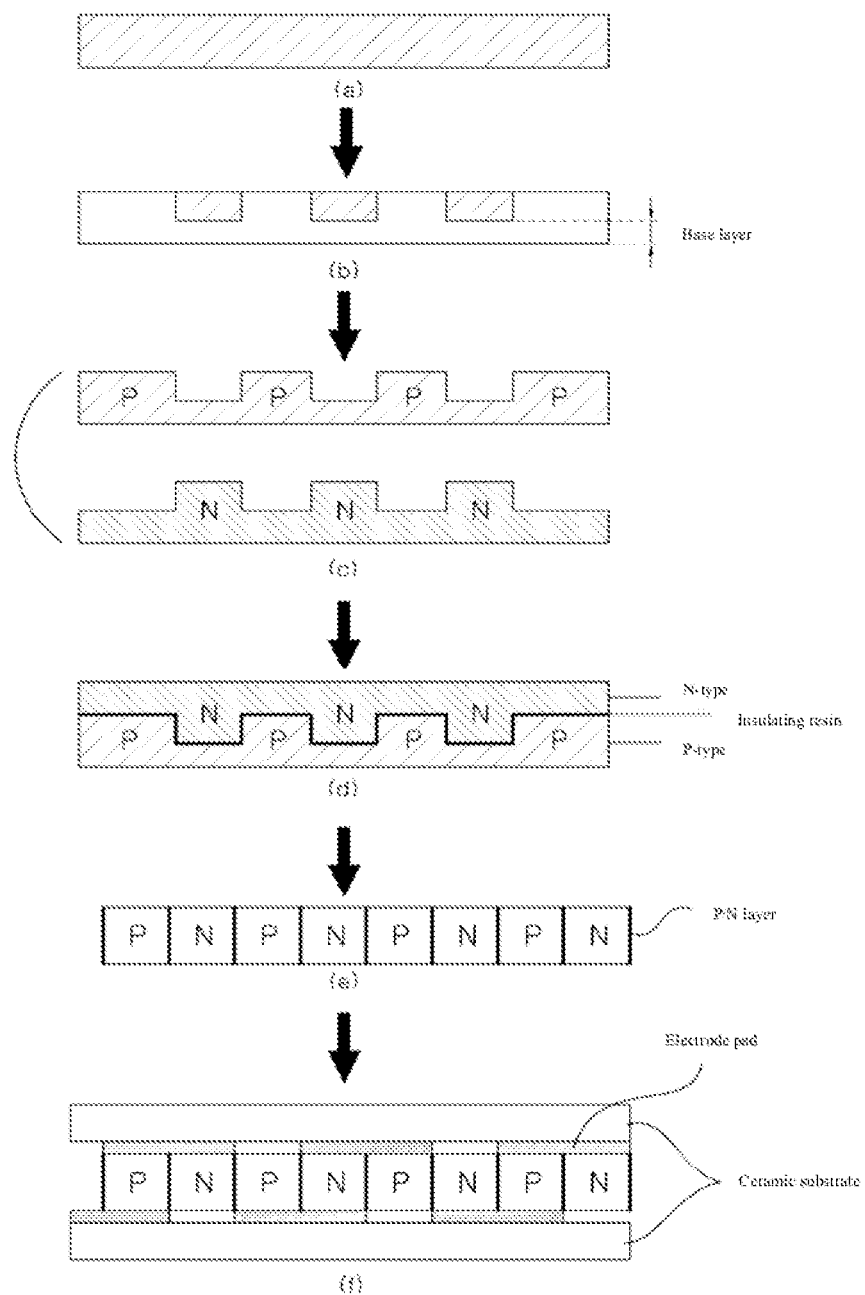

[FIG. 5]
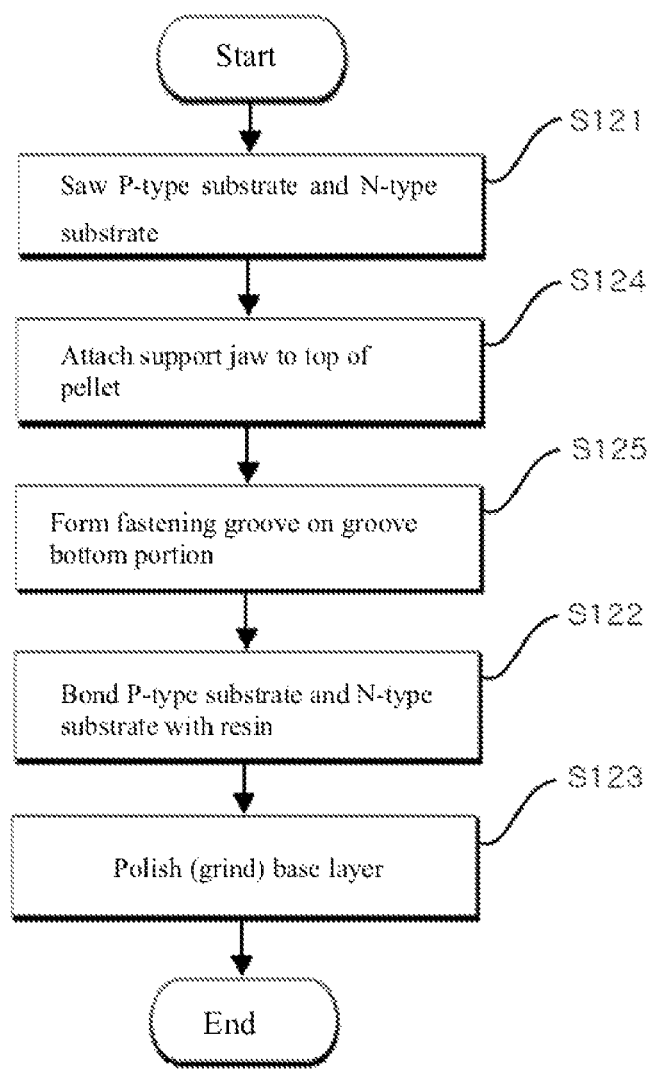

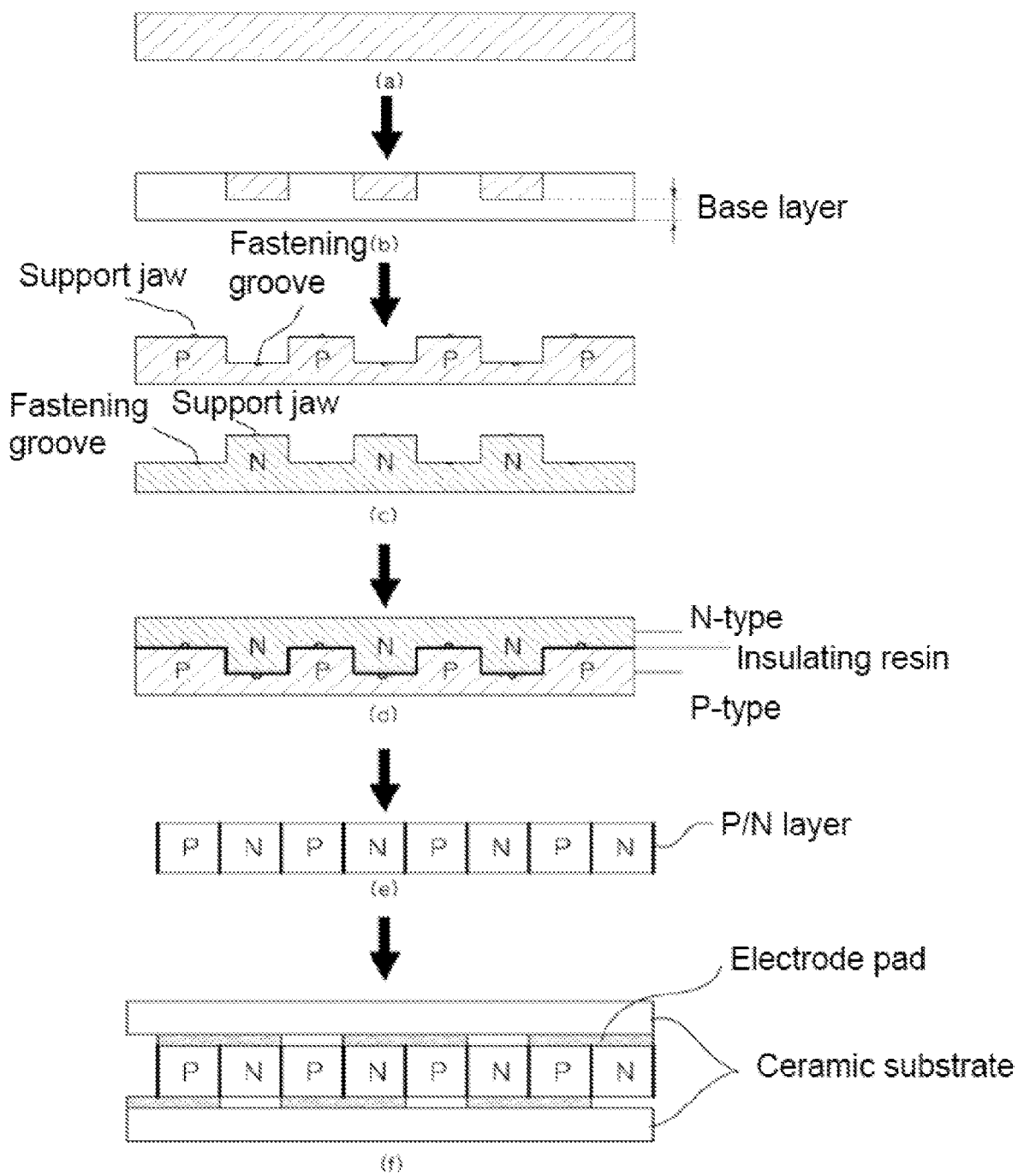

METHOD OF MANUFACTURING BULK TYPE THERMOELECTRIC ELEMENT

CROSS-REFERENCE TO RELATED APPLICATIONS

This application is the U.S. National Phase under 35 U.S.C. § 371 of International Application No. PCT/KR2018/012027 filed on Oct. 12, 2018, which in turn claims the benefit of Korean Application No. 10-2018-0120192 filed on Oct. 10, 2018, the disclosures of which are incorporated by reference into the present application.

TECHNICAL FIELD

The present invention relates to a method of manufacturing a bulk type thermoelectric element, and more particularly, to a method of manufacturing a bulk type thermoelectric element implemented so as to reduce manufacturing cost as well as simplify a manufacturing process. The present invention claims the benefit of the filing date of Korean Patent Application No. 10-2018-0120192 filed on Oct. 10, 2018, the entire contents of which are incorporated herein.

BACKGROUND ART

Recently, thermoelectric elements have been used in various fields, and as an electronic cooling method using a Peltier effect, the thermoelectric elements have been used in various household appliances such as wine cellars and water purifiers from cosmetic refrigerators.

In particular, due to the expansion of energy harvesting technology, a thermoelectric energy harvesting field, which generates electricity with a small temperature difference using a Seebeck effect of the thermoelectric element, has been also widely expanded and applied, resulting in increasing the demand for thermoelectric elements.

However, there are limitations that cannot be solved in manufacturing the thermoelectric element, so that there is a limitation that the manufacturing process is complicated and the manufacturing cost is lowered, and thus, there is a limitation in lowering the price of the element.

A conventional manufacturing process of the thermoelectric element starts from preparing a P-type thermoelectric element substrate and an N-type thermoelectric element substrate from an ingot manufactured through a sintering process of the material, and cutting the substrates into desired sizes.

The cut-off pellets are usually cut into sizes of 1.4 mm wide×1.4 mm long×1.6 mm thick, P-type pellets and N-type pellets are transferred and mounted on an electrode plate of a substrate on which electrical connection patterns are formed, and upper and lower substrates are soldered to complete the thermoelectric element.

Since the performance of a thermoelectric element results in how many P-type N-type pellets are mounted in a unit area, the performance may be improved if the P-type N-type pellets can be made small and mounted at high density.

However, with the conventional manufacturing method, since there is a limitation in cutting and processing into very small pellets due to the characteristics of a thermoelectric material, most of the pellets are at a level of several mm, and thus, there is a problem that it is very difficult to cut and process pellets at the level of several um.

On the other hand, in a conventional manufacturing technology, there is a problem in that a large manufacturing time is required for a small surface mounting operation in which hundreds of small pellets are manually moved and placed on an electrode plate, resulting in high manufacturing period and labor costs.

In order to solve this problem, there are cases in which an SMD device is used for automation and mass-production, but there is a limit to the pellet size that can be made with the SMD device, which also has limitations in automatically surface mounting smaller pellets.

In other words, with a conventional thermoelectric element manufacturing method, the manufacturing cost of manufacturing the thermoelectric element is high, and high-density surface mounting is not possible with the cutting processing method, and thus there is a limit to manufacturing a high-density thermoelectric element.

DISCLOSURE

Technical Problem

An aspect of the present invention is to provide a method for manufacturing a bulk type thermoelectric element implemented to reduce manufacturing costs as well as to simplify a manufacturing process by cutting and processing only the depth of a um level of P-type and N-type substrates as thermoelectric materials to maintain a root layer at the bottom thereof, which are thermoelectric materials.

The technical objects of the present invention are not restricted to the technical object mentioned as above. Unmentioned other technical objects will be apparently appreciated by those skilled in the art by referencing the following description.

Technical Solution

According to an embodiment of the present invention, a method of manufacturing a bulk type thermoelectric element includes the steps of: preparing two types of P-type and N-type substrates by slicing a thermoelectric element material; bonding P-type pellets formed on the P-type substrate and N-type pellets formed on the N-type substrate to each other to alternately engaging with each other, and then polishing (grinding) the bottom of each substrate to form a P/N layer in which the P-type pellets and the N-type pellets are cross-formed; and assembling ceramic substrates with conductive electrode pads (PAD) on the top and the bottom of the P/N layer to complete a thermoelectric element.

In an embodiment, the forming of the P/N layer may include the steps of: sawing each substrate by forming pellets in the form of a quadrangular protrusion in a row on the top of the base layer so that the top of the P-type substrate and the top of the N-type substrate engage with each other; bonding the top of the P-type substrate and the top of the N-type substrate, which are sawed, with an insulating resin; and polishing (grinding) the base layer to leave only the P/N layer when the insulating resin is cured.

In an embodiment, the bonding may include applying the insulating resin on the top of the lower substrate; and fastening the remaining substrate to engage with the top of the substrate applied with the insulating resin.

In an embodiment, the insulating resin may be formed of a resin material of urethane or silicone.

In an embodiment, the pellets may be formed in sizes of 125 to 250 um wide×125 to 250 um long×100 to 500 um thick.

In an embodiment, the forming of the P/N layer may further include attaching a support jaw having a predetermined height in a longitudinal direction along an upper central portion of the processed pellet, after the sawing.

In an embodiment, the forming of the P/N layer may further include the forming of the P/N layer further includes forming a fastening groove having a shape corresponding to the shape of the support jaw in the bottom portion of a groove formed between the support jaw and an opposed pellet.

In an embodiment, in the bonding with the insulating resin, when the top of the P-type substrate and the top of the N-type substrate sawed engage with each other, the support jaw may be inserted into the fastening groove.

In an embodiment, in the polishing (grinding) of the base layer, the support jaw may be polished when the base layer is polished.

In an embodiment, the forming of the P/N layer may further include forming a pad fastening groove at a depth corresponding to a height of an electrode pad on the top and the bottom of the P/N layer where the electrode pad is positioned so that the electrode pad is fastened, after the polishing (grinding) of the base layer.

In an embodiment, the completing of the thermoelectric element may include assembling ceramic substrates at the top and the bottom of the P/N layer by using reflow soldering.

Advantageous Effects

According to an aspect of the present invention described above, it is possible to cut a thermoelectric material with weak brittleness in units of um, which is much smaller than that of a conventional cutting in units of mm, and particularly, to be completely processed so as to remain on the substrate as it is, not in the form of pellets. Accordingly, there are an innovative manufacturing process saving effect and a labor cost saving effect that there is no need to move and mount separate pellets one by one.

While thousands of pellets are attached to the P-type and N-type substrates, the P-type and N-type substrates can be bonded and assembled up and down, so that there is no need for separate surface mounting.

In other words, since it is possible to manufacture pellet units directly without moving for separate surface mounting by making thermoelectric elements having a root layer on the P-type/N-type thermoelectric material substrate by micro-cutting, there is no need to move small elements one by one while solving the limitation of the cutting processing size and it is possible to simplify the manufacturing process and reduce manufacturing cost by greatly improving the efficiency per unit area.

DESCRIPTION OF DRAWINGS

FIG. 1 is a diagram illustrating a method of manufacturing a thermoelectric element in the related art.

FIG. 2 is a flowchart illustrating a method of manufacturing a bulk type thermoelectric element according to an embodiment of the present invention.

FIG. 3 is a flowchart illustrating an example of forming a P/N layer of FIG. 2.

FIG. 4 is a diagram illustrating a method of manufacturing a bulk type thermoelectric element according to an embodiment of the present invention.

FIG. 5 is a flowchart illustrating another example of forming a P/N layer of FIG. 2.

FIG. 6 is a diagram illustrating a method of manufacturing a bulk type thermoelectric element according to another embodiment of the present invention.

MODES FOR THE INVENTION

The detailed description of the present invention to be described below refers to the accompanying drawings, which illustrate specific embodiments in which the present invention may be implemented. These embodiments will be described in detail sufficient to enable those skilled in the art to implement the present invention. It should be understood that various embodiments of the present invention are different from each other, but need not be mutually exclusive. For example, specific shapes, structures, and characteristics described herein may be implemented in other embodiments without departing from the spirit and scope of the present invention in connection with one embodiment. In addition, it should be understood that the location or arrangement of individual components within each disclosed embodiment may be changed without departing from the spirit and scope of the present invention. Accordingly, the detailed description to be described below is not intended to be taken in a limiting meaning, and the scope of the present invention, if properly described, is limited only by the appended claims, in addition to all scopes equivalent to those claimed by the appended claims. In the drawings, like reference numerals refer to the same or similar functions over several aspects.

Hereinafter, preferred embodiments of the present invention will be described in more detail with reference to the accompanying drawings.

FIG. 1 is a diagram illustrating a method for manufacturing a thermoelectric element in the related art.

Referring to FIG. 1, (a) a circular substrate (plate) ingot of a thermoelectric element material is sliced to prepare P-type and N-type substrates, respectively, (b) P-type and N-type pellets are prepared through a sawing process, respectively, wherein the pellet is usually manufactured with 1.4 mm wide×1.4 mm long×1.6 mm high. At this time, due to the characteristic of the material, there is a problem that chipping (cracking) occurs when processing a size of mm or less (in micro units) to reduce the size.

(c) each of the P-type and N-type pellets prepared by sawing each of the P-type and N-type plates is "pick & placed" on a conductive electrode pad (PAD) manually or by using a surface mount device (SMD), or several hundred pellets are moved at a time using a jig. At this time, there is also a problem in that a limitation on mounting by automatic transfer of pellets of 1 mm×1 mm×1 mm or less (that is, a limitation in handling that occurs when individual cut pellets are moved and mounted one by one) occurs.

(d) Finally, the manufacturing of the thermoelectric element is completed by covering the upper and lower plates and completing the mounting by a reflow soldering process.

The thermoelectric element manufactured by this method is made of a P-type and an N-type of a Bi—Te-based plate, not silicon-based, but there is a problem that the Bi—Te-based plate is weakly brittle and cracks as described above may easily occur during sawing.

Accordingly, the method of manufacturing the thermoelectric element in the related art had problems in limitations in that 1) manufacturing costs increase due to excessive labor costs or equipment costs due to manual work or use of SMD equipment when moving and mounting the pellets, 2) it takes a lot of time to move and mount pellets one by one, and 3) when processing fine pellets, the defect rate increases, and it is difficult to manufacture high-density thermoelectric materials due to difficulty in moving and mounting. In addition, according to the method of manufacturing the thermoelectric element in the related art, 4) the thermoelectric elements are usually mounted on a substrate with an area of 40 mm wide×40 mm long with 254 P-type or N-type pellets (127 couples of P-type and N-type pellets to be bound). As the method of manufacturing the thermoelectric element in the related art, since there is a limitation to manufacturing P-type or N-type pellets up to a size of at least 1 mm×1 mm×1 mm, there is a limit that only at least 24/cm$^2$ of P-type or N-type pellets may be mounted on a substrate with an area of 40 mm wide×40 mm long.

FIG. 2 is a flowchart illustrating a method of manufacturing a bulk type thermoelectric element according to an embodiment of the present invention.

Referring to FIG. 2, in a method of manufacturing a bulk type thermoelectric element according to an embodiment of the present invention, first, a material of the thermoelectric element is sliced to form two types of P-type and N-type substrates (S110).

When the substrates are fabricated in step S110 described above, P-type pellets formed on the P-type substrate and N-type pellets formed on the N-type substrate are bonded to each other to alternately engage with each other, and then the bottom of each substrate is polished (ground) to form a P/N layer in which the P-type pellets and the N-type pellets are cross-formed (S120).

When the P/N layer is formed in step S120 described above, ceramic substrates having conductive electrode pads PAD formed on the top and the bottom of the P/N layer are assembled to complete a thermoelectric element (S130).

In an embodiment, in step S130 of completing the thermoelectric element, the ceramic substrates may be assembled on the top and the bottom of the P/N layer using reflow soldering.

The bulk type thermoelectric element manufactured by the method of manufacturing the bulk-type thermoelectric element having the above-described steps consists of two metal plates or semiconductor plates to generate an electromotive force due to a Seebeck effect.

An element that generates the Seebeck effect refers to a circuit element that generates a thermoelectromotive force by bonding both ends of a metal or semiconductor and giving a temperature difference thereto.

This Seebeck effect (or phenomenon) for Cu, Bi, or Sb was discovered by T. Seebeck in 1821, and thermocouple type thermometers that measure a thermoelectromotive force and convert the measured thermoelectromotive force to a temperature are widely used industrially, and various thermocouple types have been developed up to cryogenic temperature from high temperature.

Thermocouples for temperature measurement include silver-gold (added iron), chromel-gold (added iron), copper-constantan, chromel-constantan, chromel-alumel, platinum/rhodium-platinum, tungsten-tungsten rhenium, etc.

On the other hand, since semiconductors have a thermoelectric power (Seebeck coefficient) 1000 times larger than that of metals, the efficiency of generating a thermoelectromotive force using the Seebeck coefficient is relatively high.

After all, the Seebeck effect is simply an effect opposite to a Peltier effect, and is a phenomenon in which electricity is generated when a temperature difference is applied to both sides.

When the temperature difference occurs at both ends of heat absorption and heat dissipation, in the case of an n-type semiconductor, electrons in a high-temperature end have higher kinetic energy than electrons in a low-temperature end, so that the electrons in the high-temperature end diffuse to the low-temperature end to reduce energy.

As the electrons move to the low-temperature end, the low-temperature end is charged with "negative (−)" and the high-temperature end is charged with "positive (+)" to generate a potential difference between the two ends, which becomes a Seebeck voltage.

The generated Seebeck voltage acts in a direction to send electrons back to the high-temperature end, and becomes in equilibrium when the Seebeck potential is precisely balanced with a thermal driving force that causes electrons to move to the low-temperature end.

The Seebeck voltage (V) generated by the temperature difference between the two ends is called a thermoelectromotive force.

In the case of the bulk type thermoelectric element assembled in step S130 described above, an electromotive force of about 0.13 mW may be generated.

According to the method of manufacturing the bulk type thermoelectric element having the steps described above, it is possible to cut a thermoelectric material with weak brittleness in units of um, which is much smaller than that of a conventional cutting in units of mm, and particularly, to be completely processed so as to remain on the substrate as it is, not in the form of pellets. Accordingly, there are an innovative manufacturing process saving effect and a labor cost saving effect that there is no need to move and mount separate pellets one by one.

In addition, while thousands of pellets are attached to the P-type and N-type substrates, the P-type and N-type substrates can be bonded and assembled up and down, so that there is no need for separate surface mounting.

That is, since it is possible to manufacture pellet units directly without moving for separate surface mounting by making thermoelectric elements having a root layer on the P-type/N-type thermoelectric material substrate by micro-cutting, there is no need to move small elements one by one while solving the limitation of the cutting processing size and it is possible to simplify the manufacturing process and reduce manufacturing cost by greatly improving the efficiency per unit area.

FIG. 3 is a flowchart illustrating an example of forming a P/N layer of FIG. 2.

Referring to FIG. 3, in the forming of the P/N layer (S120), each substrate is sawed with pellets in the form of a quadrangular protrusion formed in a row on the top of the base layer so that the top of the P-type substrate and the top of the N-type substrate engage with each other (see FIG. 4C) (S121).

At this time, the size of the pellet is preferably formed of 125 to 250 um wide×125 to 250 um long×100 to 500 um thick.

Pellets of thermoelectric elements manufactured by the conventional method had limitations in manufacturing due to the limitation in the size of 1 mm×1 mm×1 mm. However, according to the present invention, it is possible to manufacture a more efficient thermoelectric element because cracks or the like are not generated even when pellets having a smaller size than the conventional method are manufactured.

The top of the P-type substrate and the top of the N-type substrate, which are sawed in step S121, are bonded to each other with an insulating resin made of a urethane or silicone resin material (S122).

In an embodiment, the bonding step (S122) may include applying an insulating resin to the top of the lower substrate, and then fastening the remaining substrate to engage with the top of the substrate on which the insulating resin is applied.

When the insulating resin used in step S122 described above is cured, the base layer is polished (ground) so that only the P/N layer is left (S123), thereby removing the base layer unnecessary for manufacturing the thermoelectric element and leaving only the P/N layer.

The forming of the P/N layer (S120) having the steps as described above may further include a step (not illustrated for convenience of description) of forming a pad fastening groove at a depth corresponding to the height of the electrode pad on the top and the bottom of the P/N layer on which the electrode pad is positioned so that the electrode pad may be fastened, after the polishing (grinding) of the base layer.

As the pad fastening groove is formed, a space that may occur between the P/N layer and the ceramic substrate due to a height difference in the electrode pad may be removed, thereby further improving the thermoelectric efficiency of the thermoelectric element.

FIG. 4 is a diagram illustrating a method of manufacturing a bulk type thermoelectric element according to an embodiment of the present invention.

Referring to FIG. 4, unlike the conventional method of manufacturing the substrate by (a) slicing a thermoelectric element material circular substrate (plate) ingot to prepare P-type and N-type substrates, respectively, and (b) cutting the substrate through sawing, (c) the P-type and N-type substrates are processed at only a required depth excluding the base layer (serving as a root).

(d) After sawing the P-type or N-type substrate to the required depth, the top and bottom of the substrate are bonded to each other with an insulating resin (resin materials such as urethane, silicone, etc.), and thus, the P-N arrangement is simply completed, and there is no need for a separate pellet transfer and mounting process.

(e) After curing the resin, if the base layer of the upper/lower plate is polished (ground), only the P/N layer in which the P-type and N-type pellets firmly maintained by the cured resin are repeatedly cross-formed is left. (f) The upper/lower ceramic substrates on which the electrode pads are formed are assembled on the top/bottom of the P/N layer to complete the manufacturing process of the thermoelectric element.

FIG. 5 is a flowchart illustrating another example of forming the P/N layer of FIG. 1.

Referring to FIG. 5, the forming of the P/N layer (S120) includes attaching a support jaw having a predetermined height in a longitudinal direction along an upper central portion of the processed pellet (S124), after the sawing (S121).

At this time, the support jaw is inserted into a fastening groove to be described below to be prevented from shaking during bonding by the resin, thereby assisting to form a more robust and regular P/N layer.

When the support jaw is attached in step S124 described above, a fastening groove having a shape corresponding to the shape of the support jaw is formed in the bottom portion of the groove formed between the support jaw and an opposed pellet (S125).

In an embodiment, in the step (S122) of bonding with the insulating resin, after applying the insulating resin, when the top of the P-type substrate and the top of the N-type substrate sawed engage with each other, the support jaw is inserted into the fastening groove to prevent each substrate from moving.

In an embodiment, in the step (S123) of polishing (grinding) the base layer by polishing, the support jaw is polished when polishing the base layer, the base layer unnecessary for manufacturing the thermoelectric element is removed and only the P/N layer is left.

FIG. 6 is a diagram illustrating a method of manufacturing a bulk type thermoelectric element according to another embodiment of the present invention.

Referring to FIG. 6, unlike the conventional method of manufacturing the substrate by (a) slicing a thermoelectric element material circular substrate (plate) ingot to prepare P-type and N-type substrates, respectively, and (b) cutting the substrate through sawing, (c) the P-type and N-type substrates are processed at only a required depth excluding the base layer (serving as a root) to form a support jaw and a fastening groove on the top and the groove of the P-type and N-type substrates.

(d) After sawing the P-type or N-type substrate to the required depth, the P-type and N-type substrates are bonded to each other with an insulating resin (resin materials such as urethane, silicone, etc.) by fastening the support jaw to be inserted into the fastening groove, and thus, the P-N arrangement is simply completed, and there is no need for a separate pellet transfer and mounting process.

(e) After curing the resin, if the base layer of the upper/lower plate is polished (ground), only the P/N layer in which the P-type and N-type pellets firmly maintained by the cured resin are repeatedly cross-formed is left. (f) The upper/lower ceramic substrates on which the electrode pads are formed are assembled on the top/bottom of the P/N layer to complete the manufacturing process of the thermoelectric element.

As described above, the present invention has been described with reference to the embodiments, but it will be appreciated by those skilled in the art that various modifications and changes of the present invention can be made without departing from the spirit and the scope of the present invention which are described in the appended claims.

The invention claimed is:

1. A method of manufacturing a bulk type thermoelectric element comprising:
preparing a P-type substrate and an N-type substrate with thermoelectric element material;
sawing one side of each substrate to form pellets in the form of quadrangular protrusions in a row such that the pellet of the P-type substrate and the pellet of the N-type substrate are capable of being alternatively engaged with each other, wherein unsawed portion on the other side of the each substrate forms a base layer;
attaching a support jaw of a predetermined height in a longitudinal direction along an upper central portion of each of the pellets of the P-type substrate and the N-type substrate;
forming a fastening groove along a central portion of bottom a groove formed between the pellets such that the support jaw and the fastening grove is capable of being engaged with each other when the pellets of the P-type substrate and the pellets of the N-type substrate are engaged alternatively with each other;
inserting and bonding the support jaw into the fastening groove by alternatively engaging the pellets of the P-type substrate and the pellets of the N-type substrate after applying an insulating resin on the top of the pellets of the P-type substrate and/or the N-type substrate;

polishing or grinding the base layer of the P-type substrate and the N-type substrate until the support jaw is removed to form only a P/N layer after the insulating resin is cured; and assembling ceramic substrates with conductive electrode pads on the top and the bottom of the P/N layer to form a thermoelectric element.

2. The method of manufacturing the bulk type thermoelectric element of claim 1, wherein the insulating resin is a resin of urethane or silicone.

3. The method of manufacturing the bulk type thermoelectric element of claim 1, wherein the pellets are formed in sizes of 125 to 250 um wide×125 to 250 um long×100 to 500 um thick.

4. The method of manufacturing the bulk type thermoelectric element of claim 1, wherein forming of the P/N layer further includes forming a pad fastening groove at a depth corresponding to a height of an electrode pad on the top and the bottom of the P/N layer where the electrode pad is positioned such that the electrode pad is fastened to the pad fastening groove after polishing or grinding of the base layer.

5. The method of manufacturing the bulk type thermoelectric element of claim 1, wherein the step of assembling ceramic substrates includes assembling ceramic substrates at the top and the bottom of the P/N layer by using reflow soldering after forming the thermoelectric element.

\* \* \* \* \*